US011185112B2

(12) United States Patent
Bilat

(10) Patent No.: US 11,185,112 B2
(45) Date of Patent: Nov. 30, 2021

(54) CONSUMABLE IDENTIFICATION

(71) Applicant: Altria Client Services LLC, Richmond, VA (US)

(72) Inventor: Stephane Bilat, Areuse (CH)

(73) Assignee: Altria Client Services LLC, Richmond, VA (US)

(*) Notice: Subject to any disclaimer, the term of this patent is extended or adjusted under 35 U.S.C. 154(b) by 219 days.

(21) Appl. No.: 16/217,518

(22) Filed: Dec. 12, 2018

(65) Prior Publication Data

US 2019/0110520 A1 Apr. 18, 2019

Related U.S. Application Data

(63) Continuation of application No. PCT/EP2018/072262, filed on Aug. 16, 2018.

(30) Foreign Application Priority Data

Sep. 8, 2017 (EP) ..................... 17190202

(51) Int. Cl.
*A24F 40/53* (2020.01)
*A24D 1/20* (2020.01)
(Continued)

(52) U.S. Cl.
CPC ............ *A24F 40/53* (2020.01); *A24B 15/167* (2016.11); *A24D 1/20* (2020.01); *A24F 40/40* (2020.01);
(Continued)

(58) Field of Classification Search
CPC ..... A24F 47/008; A24B 15/167; G01N 27/12; H01R 31/08
(Continued)

(56) References Cited

U.S. PATENT DOCUMENTS 5,302,935 A * 4/1994 Chatterjee .............. G01N 27/12
338/34
2015/0053217 A1 2/2015 Steingraber et al.
(Continued)

FOREIGN PATENT DOCUMENTS

EP 2399636 A1 * 12/2011 ............ A61M 15/06
EP 2875740 A2 5/2015
WO WO-2016107764 A2 7/2016

OTHER PUBLICATIONS

International Search Report and Written Opinion for corresponding European Application No. PCT/EP2018/072262 dated Nov. 15, 2018.
(Continued)

*Primary Examiner* — Tarun Sinha
(74) *Attorney, Agent, or Firm* — Harness, Dickey & Pierce, P.L.C.

(57) ABSTRACT

An aerosol-generating device includes an interface, one or more pairs of conductors, and electrical circuitry. The interface is configured to receive at least a portion of a consumable. The consumable comprises one or more conductive portions arranged to identify the consumable. The one or more pairs of conductors define at least a portion of one or more circuits. The one or more pairs of conductors are selectively electrically couplable with the one or more conductive portions of the consumable if the consumable is received by the interface. The electrical circuitry is configured to identify the consumable based on completion of the one or more circuits defined by the one or more pairs of conductors and the one or more conductive portions if the consumable is received by the interface.

20 Claims, 13 Drawing Sheets

(51) Int. Cl.
   *A24F 40/40* (2020.01)
   *A24B 15/167* (2020.01)
   *G01N 27/12* (2006.01)
   *H01R 31/08* (2006.01)
   *A24F 40/10* (2020.01)
   *A24F 40/20* (2020.01)

(52) U.S. Cl.
   CPC ............ *G01N 27/12* (2013.01); *H01R 31/08* (2013.01); *A24F 40/10* (2020.01); *A24F 40/20* (2020.01)

(58) Field of Classification Search
   USPC .......................................................... 73/23.2
   See application file for complete search history.

(56) References Cited

U.S. PATENT DOCUMENTS

| 2017/0013879 A1 | 1/2017 | Frisbee et al. | |
| 2017/0135405 A1* | 5/2017 | Reevell | A24F 47/008 |
| 2018/0368474 A1* | 12/2018 | Bache | A24F 40/53 |

OTHER PUBLICATIONS

European Search Report for European Application No. 17190202 dated Mar. 15, 2018.
International Preliminary Report on Patentability dated Sep. 10, 2019, issued in corresponding International Application No. PCt/EP2018/072262.

* cited by examiner

280

| Rt | Pair 274 | Pair 275 | Pair 276 | Pair 277 |
|---|---|---|---|---|
| 179 KΩ | X | X | X | X |
| 169 KΩ | X | X | X |  |
| 157 KΩ | X | X |  | X |
| 147 KΩ | X | X |  |  |
| ⋮ | | | | |
| 32 KΩ |  |  | X | X |
| 10 KΩ |  |  |  | X |
| 0 KΩ |  |  |  |  |

Fig. 5

CONSUMABLE IDENTIFICATION

This application is a continuation of, and claims priority to, International Application Number PCT/EP2018/072262, filed Aug. 16, 2018, which claims priority to European Application number 17190202.6, filed Sep. 8, 2017, the entire contents of each of which are incorporated herein by reference.

BACKGROUND

Field

This invention relates to apparatus, devices, and/or methods for use in identifying an aerosol-producing consumable.

Description of Related Art

Various consumables comprising various aerosol-producing substrates (also called "vapor-producing substrates") may be used with the same aerosol-generating device (also called "vapor-generating device"). Each of the various consumables may behave differently than each other when used by the same aerosol-generating device. However, aerosol-generating devices may not distinguish between the various consumables, which may result in various, and in some cases, undesirable experiences.

Further, certain information about the consumable may not be able to be known from the consumable itself, for example, if the consumable is not marked. Still further, some consumables may be expired or counterfeit, and the aerosol-generating devices may not be able determine whether the consumables are expired or counterfeit.

Therefore, such aerosol-generating devices and consumables may provide a less desirable experience because the aerosol-generating devices may not operate most effectively or efficiently without "knowing," or having the identity of, the consumable. Further, the identity of the consumable may not be known, and thus, it may not be possible to program, or configure, the aerosol-generating devices to most efficiently and most effectively generate aerosol using the consumable. Additionally, the configuring, or programming, of the aerosol-generating devices may be cumbersome and potentially error prone. Lastly, consumables may be expired, and it may be challenging to know when consumables are expired.

Many of the methods and apparatus used to identify the consumable are costly and ineffective.

SUMMARY

An aerosol-generating device may identify a consumable received by the aerosol-generating device in a simple, low-cost manner. The invention described herein may be less complex, or simpler, than the techniques which have been previously tried, which may make the invention less error prone and less costly than previous techniques.

Example embodiments disclose a consumable for use with an aerosol-generating device including an aerosol-producing substrate and one or more conductive portions arranged to identify the consumable by completing a circuit of an aerosol-generating device by contacting one or more pairs of conductors of the aerosol-generating device.

Other example embodiments disclose an aerosol-generating device including an interface, one or more pairs of conductors, and electrical circuitry. The interface is configured to receive at least a portion of a consumable. The consumable comprises one or more conductive portions arranged to identify the consumable. The one or more pairs of conductors define at least a portion of one or more circuits. The one or more pairs of conductors are selectively electrically couplable with the one or more conductive portions of the consumable if the consumable is received by the interface. The electrical circuitry includes one or more processor, and the electrical circuitry operably coupled to the one or more pairs of conductors. The controller is configured to identify the consumable based on completion of the one or more circuits defined by the one or more pairs of electrical circuitry and the one or more conductive portions if the consumable is received by the interface.

Other example embodiments disclose a method of identifying a consumable comprising receiving a consumable using an interface of an aerosol-generating device, and identifying the consumable based on completion of one or more circuits defined by one or more pairs of conductors of the aerosol-generating device and the one or more conductive portions of the consumable if the consumable is received by the interface of the aerosol-generating device. The consumable comprising an aerosol-producing substrate and one or more conductive portions identifying the consumable.

BRIEF DESCRIPTION OF THE DRAWINGS

FIG. 5 is a table 280 depicting illustrative total resistance values corresponding to pairs of conductors of the circuit of FIG. 4 for use in identifying a consumable.

DETAILED DESCRIPTION OF THE DRAWINGS

Figure 1:
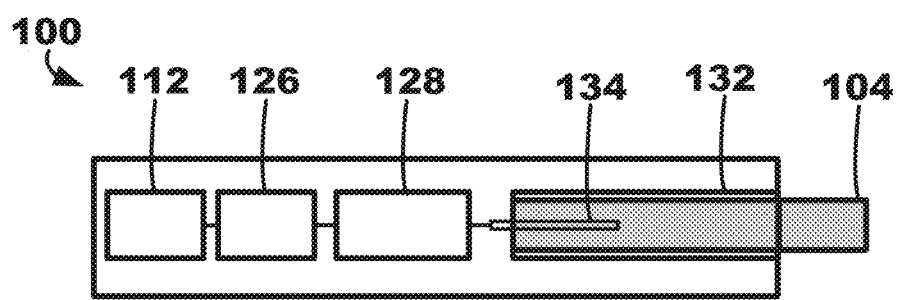
FIG. 1 is a schematic sectional view of an illustrative aerosol-generating device 100.

In various example embodiments, consumables, devices, and methods for identifying the consumables using one or more conductive portions that are part of the consumables. The conductive portions may or may not complete one or more circuits of an aerosol-generating device (also called "vapor-generating device"), within which the consumable is interfaced with for generation of aerosol. The identity of the consumable may be determined based on the completion of the one or more circuits using the conductive portions when the consumable is interfaced with the device. An example consumable may be used with an aerosol-generating device to generate, or produce, aerosol. The consumable may include an aerosol-producing substrate (also called "vapor-producing substrate") and one or more conductive portions identifying the consumable. The one or more conductive portions may be used to complete one or more circuits of an aerosol-generating device such that the aerosol-generating device may be able to identify the consumable.

In various example embodiments, an example aerosol-generating device may include an interface to receive at least a portion of an example consumable and one or more pairs of conductors defining at least a portion of one or more circuits. The one or more pairs of conductors may be selectively electrically couplable with the one or more conductive portions of the consumable when the consumable is received by the interface. The example aerosol-generating device may further include a controller comprising one or more processors and operably coupled to the one or more pairs of conductors. The controller may be configured to identify the consumable based on completion of the one or more circuits defined by the one or more pairs of conductors and the one or more conductive portions when the consumable is received by the interface. Thus, consumables, devices, and methods described herein may provide a cost effective and simple way to identify consumables.

In various example embodiments, an example method of identifying a consumable may include receiving an example consumable using an interface of an example aerosol-generating device and identifying the consumable based on completion of one or more circuits defined by one or more pairs of conductors of the aerosol-generating device and the one or more conductive portions of the consumable when the consumable is received by the interface of the aerosol-generating device.

Various example embodiments of the apparatus, devices, and methods according to the present invention may provide one or more advantages relative to currently available aerosol-generating articles and associated systems. The example apparatus, devices, and methods may provide adult vapers using the device a more desirable experience since the consumable may be efficiently and conveniently identified. Further, example aerosol-generating devices may modify operating characteristics, or parameters, based on the identity of the consumable to efficiently and effectively produce aerosol using the consumable. The efficient and effective production of aerosol may improve the aerosol because the aerosol may be optimally produced thereby providing a satisfying aerosol delivery experience. In other words, the identity information may be used by the devices to adjust one or more operating characteristics of the devices.

Further, identification of the consumable may allow the example devices and apparatus to determine various information about the consumable that may be advantageous. For example, it may be determined whether the consumable is an authentic consumable, when the consumable has expired, and where the consumable was manufactured. Thus, inauthentic consumables, expired consumables, or consumables from a non-desired origin location may not be inadvertently utilized. Still further, identification of the consumable may allow the example devices and apparatus to maintain a record of the consumables used in a user-friendly, convenient manner. Additionally, the identify information may be transmitted, or communicated, to apparatus other than the aerosol-generating devices to log or display information with respect to the identified consumables.

As used herein, "aerosol-producing substrate" is any substrate capable of releasing, upon heating, volatile compounds, which can form an aerosol. The aerosols generated from aerosol-producing substrates according to the present disclosure may be visible or invisible and may include vapours (for example, fine particles of substances, which are in a gaseous state, that are ordinarily liquid or solid at room temperature) as well as gases and liquid droplets of condensed vapours.

As used herein, a "consumable" is any disposable product capable of including (e.g., holding, containing, having, storing, etc.) aerosol-producing substrate and capable of removably interfacing, or docking, with an aerosol-generating device so as to allow the aerosol-generating device to generate aerosol from the aerosol-producing substrate. The consumable may be a container holding a liquid containing aerosol-producing substrate. The consumable may be a solid containing aerosol-producing substrate.

As used herein, "aerosol-generating device" is any device configured to use, or utilize, an aerosol-producing substrate that releases volatile compounds to form an aerosol that may be dawn through outlets of the device. The aerosol-generating device may be interfaced with a consumable comprising the aerosol-producing substrate.

The term "conductive portion" refers to any conductive element operable to complete a circuit by the transmission of electricity therethrough. The conductive portion may include one or more metallic or non-metallic materials capable of conducting electricity.

As used herein, "display" is any apparatus or device capable of displaying information using, for example, a graphical user interface, etc., to perform the example functionality, methods, or logic described herein such as, for example, a liquid crystal display, an organic light-emitting diode screen, a touchscreen, a cathode ray tube display, etc.

The term "controller" and "processor" refers to any device or apparatus capable of providing suitable computing capabilities and control capabilities such as, e.g., microprocessors, digital signal processors (DSP), application specific integrated circuits (ASIC), field-programmable gate arrays (FPGA), equivalent discrete or integrated logic circuitry, or any combination thereof and of providing suitable data storage capabilities that includes any medium (e.g., volatile or non-volatile memory, a CD-ROM, magnetic recordable medium such as a disk or tape, etc.) containing digital bits (e.g., encoded in binary, trinary, etc.) that may be readable and writeable.

The term "communication interface" refers to any device or apparatus capable of providing suitable data communication capabilities between an aerosol-generating device and a user interface device such as, e.g., various telemetry circuits and antennas and may use one or more wired or wireless (e.g., radio frequency) data transmission protocols such as, e.g., BLUETOOTH, WI-FI, any protocol in the ultra-high frequency (UHF) band, any protocol in the super high frequency (SHF) band, low frequencies, or combinations thereof.

The present invention relates to identification of consumables for use with aerosol-generating devices that are configured to use aerosol-producing substrates (e.g., comprising nicotine-containing material) from the consumables to generate aerosol containing particulate matter such as nicotine. As described herein, the consumables may include liquids or solids containing the aerosol-producing substrate. For example, the consumable could range, according to the nature of the device, from a cartridge holding a supply of the liquid aerosol-forming substrate, to an e-liquid storage bottle (which may be used to fill the device e-liquid tank), to stick with sensorial material (for instance, a stick with tobacco cast leaf).

The consumable may include a container to hold the aerosol-producing substrate. The container may be wrapping paper that is wrapped about a solid consumable (e.g., a heat stick). Further, the container may be a bottle or container that holds a liquid including an aerosol-producing substrate. Further, a wrapping paper may be wrapped about the bottle or container. It may be described that the outside part of the consumable is the container.

The consumables may include one or more conductive portions that may be used to identify the consumables. For example, the one or more conductive portions may define various sizes and may be located about various locations about the consumables so as to be used to identify the consumables. The various sizes and locations of the one or more conductive portions may be used to complete one or more circuits of example aerosol-generating devices, which may then be used to identify the consumable as will be further described herein.

Preferably, the one or more conductive portions are located on, or are part of, the container of the consumable. For example, the one or more conductive portions may be attached, or coupled, to a wrapper that is located on the outside of the consumable. In at least one embodiment, the one or more conductive portions are "printed" onto the container.

The conductive portions may include any conductive material such as metal or metallic or semi-metallic material. The conductive portions may include (e.g., be formed of iron, tin, steel, lead, aluminum, gold, nickel, bismuth, antimony, indium, silver, zinc, germanium, platinum, and combinations or alloys thereof.

The consumable may further include, or define, an interface configured to be interfaced within aerosol-generating devices to allow the aerosol-generating devices to use the one or more conducive portions to identify the consumable. Further, the interface may further allow the aerosol-generating devices to receive the aerosol-producing substrate from the consumable. In other words, the consumable may include a contact zone that is configured to be coupled, or attached, to the aerosol-generating device that positions the one or more conductive portions of the consumable so as allow the aerosol-generating device to identify the consumable using the one or more conductive portions. As will be further described herein, the aerosol-generating device may also include, or define, an interface or contact zone configured to be interfaced with the interface or contact zone of the consumable. The contact zone of the consumable may be in contact with the contact zone of the aerosol-generating device when the consumable and the aerosol-generating device are interfaced, or docked, together. In at least one example, the aerosol-generating device may define a cavity for receiving a consumable. The cavity may define the interface, or contact zone, of the aerosol-generating device such that when the consumable is received within the cavity, the interface, or contact zone, of the aerosol-generating device may be interfaced with the interface, or contact zone, of the consumable for identification purposes and aerosol-producing substrate delivery.

The aerosol-generating device may further include a heater configured to heat the aerosol-producing substrate to generate aerosol. The aerosol-generating device may include a power supply to at least power (e.g., provide electricity to) the heater and may be configured to be interfaced, or operatively coupled, to a host device. The host device may include an interface to be interfaced, or operably coupled, to the aerosol-generating device to at least charge the power supply of the aerosol-generating device.

The aerosol-generating device may include a controller comprising one or more processors (for example, microprocessors) and a communication interface (for example, wireless communication interface such as a BLUETOOTH wireless protocol interface) to transfer data to and from a user interface device. The one or more processors may operate with associated data storage, or memory, for access to processing programs or routines and one or more types of data that may be employed to carry out the illustrative methods. For example, processing programs or routines stored in data storage may include programs or routines for analyzing circuits, measuring or sensing electrical properties such as resistance, voltage, and current, circuit analysis logic, matrix mathematics, standardization algorithms, comparison algorithms, or any other processing used to implement the one or more illustrative methods and processes described herein. Further, for example, processing programs or routines stored in data storage may include processes and functions to wirelessly transfer data and commands between one or more of the aerosol-generating device, a user interface device, and remote devices or servers. The data storage, or memory, may be further configured to store data related to one or more types of consumables, one or more types of aerosol-producing substrates, one or more types of aerosol-generating devices, aerosol production or generation parameters related to the one or more types of aerosol-producing consumables, substrates, and devices such as power values, data and formulas related to the generation of particulate matter using the consumables, substrates, and devices, and any other data or formulas necessary to perform the processes and methods described herein. Preferably, the aerosol-generating device may be configured to communicate, for example, using the communication interface, with the user interface device to transmit data representative of the identified consumables or values associated therewith.

The aerosol-generating device may further include a display to display information, for example, about the identified consumable. For example, the aerosol-generating device may display the identity of the consumable, other various information about the consumable, and any other information that may be encoded in the one or more conductive portions of the consumable.

In one or more embodiments, the aerosol-generating device may be described as being implemented using one or more computer programs executed on one or more programmable processors that include processing capabilities (for example, microcontrollers, programmable logic devices, etc.), data storage (for example, volatile or non-volatile memory or storage elements), input devices, and output devices. Program code, or logic, described herein may be applied to input data to perform functionality described herein and generate desired output information. The output information may be applied as input to one or more other devices or processes as described herein or as would be applied in a known fashion.

The computer program products used to implement the processes described herein may be provided using any programmable language, for example, a high-level procedural or object orientated programming language that is suitable for communicating with a computer system. Any such program products may, for example, be stored on any suitable device, for example, a storage media, readable by a general or special purpose program, controller apparatus for configuring and operating the computer when the suitable device is read for performing the procedures described herein. In other words, at least in one embodiment, the user interface device may be implemented using a non-transitory computer readable storage medium, configured with a computer program or computer readable instruction, where the storage medium so configured causes the computer to operate in a specific and predefined manner to perform functions described herein. In other words, a non-transitory computer readable storage medium includes computer readable instruction stored thereon which, when run on programmable electric circuitry, causes the programmable electric circuitry to perform the functions described herein.

The exact configuration of the controller of the aerosol-generating device is not limiting and essentially any device capable of providing suitable computing capabilities and control capabilities to implement the illustrative methods described herein may be used. In view of the above, it will be readily apparent that the functionality as described in one or more embodiments according to the present invention may be implemented in any manner as would be known to one skilled in the art. As such, the computer language, the controller, or any other software/hardware which is to be used to implement the processes described herein shall not be limiting on the scope of the systems, processes, or programs (for example, the functionality provided by such processes or programs) described herein. The methods and processes described in this disclosure, including those attributed to the systems, or various constituent elements, may be implemented, at least in part, in hardware, software, firmware, or any combination thereof. For example, various example embodiments of the techniques may be implemented within one or more processors, including one or more microprocessors, DSPs, ASICs, FPGAs, CPLDs, microcontrollers, or any other equivalent integrated or discrete logic circuitry, as well as any combinations of such elements. When implemented in software, the functionality ascribed to the systems, devices, and methods described in this disclosure may be embodied as instructions on a computer-readable medium such as RAM, ROM, NVRAM, EEPROM, FLASH memory, magnetic data storage media, optical data storage media, or the like. The instructions may be executed by one or more processors to support one or more example embodiments of the functionality.

The aerosol-generating device may further include one or more pairs of conductors. Each pair of conductors may be configured to be "shorted" or left "open" by a conductive portion of the consumable, and completion of the circuits defined by the pair of conductors may be used to determine, or identify, the consumable. For example, it may be described that the one or more pairs of conductors are selectively electrically couplable with the one or more conductive portions of the consumable when the consumable is received by the interface of the aerosol-generating device.

The controller of the aerosol-generating device may be operatively coupled to the one or more pairs of conductors and configured to identify the consumable based on completion of the one or more circuits defined by the one or more pairs of conductors and the one or more conductive portions when the consumable is received by the interface. Thus, an illustrative method of using the aerosol-generating device and consumable to identify the consumable may include receiving the consumable using an interface of an aerosol-generating device and identifying the consumable based on completion of one or more circuits defined by one or more pairs of conductors of the aerosol-generating device and the one or more conductive portions of the consumable when the consumable is received by the interface of the aerosol-generating device.

More specifically, each of the one or more circuits may be checked for completion. Depending on the type and configuration of the one or more circuits, the controller or another device may iteratively check each circuit or may determine which of the one or more circuits are "open" or "closed" depending on one or more electrical parameters or properties measured therefrom. For example, various voltages and resistances may be measured from one or more nodes of the one or more circuits to determine which of the one or more circuits are "open" or "closed." Further, for example, the aerosol-generating device may include electrical circuitry that may switch among the one or more circuits to analyze each of the one or more circuits individually or together.

As described herein, the number of (e.g., amount), location, sizing, and further configuration of the one or more conductive portions of the consumable may determine which of the one or more circuits of the aerosol-generating device are "open" or "closed" when the consumable is interfaced with the aerosol-generating device. Additionally, each different consumable may have different number of (e.g., amount), location, sizing, and further configuration of the one or more conductive portions thereof such that each consumable may be identified by their own one or more conductive portions. In other words, the one or more conductive portions may be positioned in different locations, have different sizes, etc. about the consumable depending on the type of the consumable so as to complete different circuits of the one or more circuits when the consumable is received by the interface. In other words, the one or more conductive portions may be arranged to identify the consumable by completing a circuit of an aerosol-generating device by contacting one or more pairs of conductors of the aerosol-generating device. Further, the one or more conductive portions may be arranged to identify the consumable. Thus, each consumable may have a different conductive portion configuration (e.g., a different amount, or number, of conductive portions, different location of conductive portions, different sizes of conductive portions, etc.) such that each of the consumables may be distinguished by their different conductive portion configurations. The one or more conductive portions are arranged about the consumable in such a way as to identify a type of the consumable by completing different circuits of the aerosol-generating device if the consumable is received by the interface.

In one example, the aerosol-generating device may include electrical circuitry to apply a voltage to a first conductor of each of the one or more pairs of conductors and to ground a second conductor of each of the one or more pairs of conductors. Completion of the one or more circuits defined by the one or more pairs of conductors and the one or more conductive portions when the consumable is received by the interface may be determined when the voltage sensed on the first conductor changes state. In this way, each of the pairs of conductor, and thus circuits defined thereby, may be tested, either simultaneously or iteratively.

In another example, a conductive portion of the consumable may complete a circuit defined by the pair of conductors thereby bypassing a resistance positioned in the circuit, and thus, by analyzing the electrical properties or values of the circuit, it may be determined which of the circuits are "open" or "closed." For instance, the aerosol-generating device may include electrical circuitry to apply or have a resistance between a first conductor and a second conductor of each of the one or more pairs of conductors. Completion of a circuit of the one or more circuits defined by the one or more pairs of conductors and the one or more conductive portions based on the consumable being received by the interface may bypass the resistance applied between the first and second conductors of the circuit.

Additionally, in one embodiment, the electrical circuitry may define, or apply, a different resistance between the first conductor and the second conductor of each of the one or more pairs of conductors, and each of the one or more pairs of conductors and resistance applied between the first and second conductors of each pair are electrically coupled in series extending from a first node to a second node. Accordingly, each resistance between the first conductor and the second conductor of each of the one or more pairs of conductors is different. A voltage may be applied to the first node and measured at the second node to determine which of the one or more circuits are completed by the one or more conductive portions when the consumable is received by the interface. For example, a total resistance value may be determined along the series circuit defined by the pairs of conductors, and since, a different resistance is applied between each pair of conductors, the total resistance may be used to determine which of the pairs of conductors are "open" or "closed." For instance, a table or formula stored in memory may be used to determine which of the pairs of conductors are "open" or "closed" based on a total resistance value. Still further, in another embodiment, each of the one or more pairs of conductors and resistance applied between the first and second conductors of each pair are electrically coupled in series extending from a first node to a second node, and a first voltage is applied to the first node and a second voltage is measured at the second conductor of each pair of the one or more pairs of conductors to determine which of the one or more circuits are completed by the one or more conductive portions when the consumable is received by the interface. Electrical circuitry is configured to apply the first voltage to the first node and measure the second voltage at the second node to determine which of the one or more circuits is completed by the one or more conductive portions if the consumable is received by the interface.

In either of these embodiments or other examples described herein, some of the pairs of conductors may share a conductor. For example, an example aerosol-generating device may include two pairs of conductors, and each of the pairs of conductors may include one shared conductor.

Additionally, the interfaces between the consumables and aerosol-generating devices may be "keyed" or "un-keyed." In a "keyed" interface, the consumables may only be interfaced with the aerosol-generating devices in a particular orientation or position so as to align the areas or locations where the one or more conductive portions of the consumable may be located with the locations of the one or more pairs of conductors of the aerosol-generating devices for identification of the consumable. A "keyed" interface of an aerosol-generating device may be defined by one or more connection elements corresponding to a consumable to position at least a portion of the consumable in a single position with respect to the aerosol-generating device when the consumable is received by the interface.

In an "un-keyed" interface, the consumables may be interfaced with the aerosol-generating devices in any orientation or position so as to position, or align, the areas or locations where the one or more conductive portions may be located with the locations of the one or more pairs of conductors of the aerosol-generating devices for identification of the consumable. An "un-keyed" interface of an aerosol-generating device may define a multipositional connector to allow at least a portion of the consumable to be positioned in any of a plurality of different positions with respect to the aerosol-generating device when the consumable is received by the interface.

To enable use an "un-keyed" interface when identifying the consumable based on the one or more conductive portions, the one or more conductors of the aerosol-generating devices and the one or more conductive portions may define various characteristics such as position, length, and size that allow the conductive portions to "open" or "close" various pairs of conductors of the aerosol-generating devices regardless of the positioning in the "un-keyed" interface. In other words, the position of the consumable with respect to the aerosol-generating device in the "un-keyed" interface may not affect the identification of the consumable because the one or more conductors of the aerosol-generating devices and the one or more conductive portions of the consumables are configured to overcome the various positioning provided by the "un-keyed" interface.

In one or more embodiments, a conductor spacing distance is defined between a first conductor and a second conductor of each pair of the one or more pairs of conductors of the aerosol-generating device and a pair spacing distance may be defined between pairs of the one or more pairs of conductors. Each of the one or more conductive portions extends along a conductive portion length that is greater than or equal to a sum of a width of three conductors of the one or more pairs of conductors, two of the conductor spacing distances, and the pair spacing distance to, for example, overcome the various positioning provided by an "un-keyed" interface.

In one or more embodiments, the consumable may include a heating element (as opposed to or in conjunction with the aerosol-generating device) to generate aerosol from the aerosol-producing substrate. In this embodiment, the power source of the aerosol-generating device may be operably couplable to the heating element of the consumable to provide power to the heating element via at least one pair of conductors when the consumable is received by the interface. The controller of the aerosol-generating device may be configured to identify the heating element of the consumable based on completion of the one or more circuits defined by the one or more pairs of conductors and the one or more conductive portions when the consumable is received by the interface.

In one example, the one or more conductive portions may be iteratively tested, or analyzed, to determine which of the conductive portions are electrically coupled to the heater of the consumable, and once it is determined which of the conductive portions are electrically coupled to the heater, such conductive portions may be electrically coupled to the power source to deliver electricity to the heater for use in the production of aerosol. In one instance and more specifically, the power source may be selectively electrically coupled to the first conductor of each of the pairs of conductors. The aerosol-generating device may include electrical circuitry to successively electrically couple the power source to the first conductor of the pairs of conductors to apply a voltage to the first conductor of each of the pairs of conductors and to determine the completion of the one or more circuits defined by the one or more pairs of conductors and the one or more conductive portions based on the consumable being received by the interface if the voltage sensed on the first conductor changes state. Completion of the one or more circuits defined by the one or more pairs of conductors and the one or more conductive portions when the consumable is received by the interface may be determined when the voltage sensed on the second conductor of each of the pairs of conductors changes state.

In another instance and more specifically, the power source may be selectively electrically coupled to the first conductor of each of the pairs of conductors. The aerosol-generating device may include electrical circuitry to successively electrically couple the power source to the first conductor of each of the pairs of conductors to apply a voltage to the first conductor. Completion of the one or more circuits defined by the one or more pairs of conductors and the one or more conductive portions when the consumable is received by the interface is determined when the voltage sensed on the second conductor of the second conductor changes state.

Once the consumable is identified, an aerosol-generating device may execute one or more processes or operations. For example, one or more operating characteristics of the aerosol-generating device may be selected or changed based on the identified consumable to, e.g., generate aerosol according to a consumable's specifications for effective and efficient aerosol generation. Additionally, based on the identity, the aerosol-generating device may determine various information about the consumable such as one or more of authenticity information, expiration date, and location of manufacture.

In another example, such information may be encoded in the size, placement, and configuration of the one or more conductive portions of the consumable. In other words, more than or instead of identity may be determined from the one or more conductive portions. Thus, an aerosol-generating device may be configured to determine various information such as, e.g., authenticity information, expiration date, and location of manufacture, about the consumable based on the one or more circuits that are completed using the one or more conductive portions of the consumable. Additionally, once the consumable is identified, an aerosol-generating device may communicate the identity of the consumable, or the identified consumable, to a user interface device.

The present invention may include a user interface device. Preferably, the user interface device is a cellular telephone. In another embodiment, the user interface device is a smart watch. Generally, the user interface device may be described as any electronic device including a display for providing a graphical user interface capable of being interacted with by an adult vaper using the device. The user interface device includes a communication interface such as, for example, at least a telemetry circuit and an antenna, for bidirectional communication with other devices such as aerosol-generating devices, servers, network devices, personal computers, and the like and with other networks such as the internet and the like. More specifically, data and commands may be transmitted and received during uplink or downlink telemetry between the user interface device and other devices or networks using the communication interface. In at least one embodiment, the communication interface is a wireless interface using one or more wireless (for example, radio frequency) data transmission protocols such as, for example, BLUETOOTH, WI-FI, any protocol in the ultra-high frequency (UHF) band, any protocol in the super high frequency (SHF) band, low frequencies, etc. The controller and communication interface of the user interface device may be similar to that the aerosol-generating device of described herein. In other words, the electronic intelligence may part of one or both of the user interface device and the aerosol-generating device.

The user interface device may further include a display operatively coupled to the controller for the output of data via the display. The display may be further configured to depict and be used as a user interactable, graphical user interface. The graphical user interface and display may comprise a touchscreen. The graphical user interface may be described as being user interactable because the graphical user interface may be configured to allow viewing and manipulation of data on the display, to allow interaction with the user interface of the device, to allow interaction with the aerosol-generating device, and the like.

The aerosol-generating device may communicate with the user interface device to transmit information about the identified consumable to the user interface device. For example, the aerosol-generating device may transmit the identity of the consumable to the user interface device. The user interface device, in turn, may display information regarding the identified consumable for viewing. Additionally, the user interface device may record and monitor the usage of the aerosol-generating device and the amounts and types of the consumables used by the aerosol-generating device.

The user interface device may also request further information regarding the consumable from another computing device (e.g., server) over a network such as the internet. For example, an aerosol-generating device may transmit the identity of the consumable to the user interface device, and the user interface device may request more information about the consumable from a server over the internet. Once such information is received, the user interface device may display the information for review.

The identification of the consumable may be used to perform one or more processes such as, e.g., adapt the electronic power of an aerosol-generating device to specific properties of an aerosol-forming substrate (e.g., some substrates could use a specific heat curve to produce aerosol, should reach some specific temperature before delivering aerosol, should not be heated too much etc.) or of the consumable itself (e.g., consumable size, how many heaters may be used, etc.), display or transmit information to the aerosol-generating device or other electronic device linked to the aerosol-generating device about the aerosol-forming substrate of the consumable (for instance, transmit information to mobile phones to record consumption/preference, to memorize/identify the aerosol-forming substrate in case of test of a consumable etc.), and check the consumable information (e.g., to prevent counterfeit products, to check the aerosol-forming substrate expiration date etc.)

One embodiment may be described as including aerosol-generating device and a consumable that can be connected together, so that there is at least one electronic circuit having its battery and main electronic elements in the aerosol-generating device. When the consumable is connected to the aerosol-generating device, the at least one electronic circuit may have at least one of its conductors that could be closed by one or more conductive portions on the consumable. Further, the at least one electronic circuit may determine which of its conductors are closed by the one or more conductive portions of the consumable, and transmit this information to the aerosol-generating device, which can be used to identify the consumable or properties of the consumable.

The invention may further be described as allowing one or more properties or values of the consumable to be encoded by using one or more conductive portions on the consumable, so that when the aerosol-generating device and the consumable are plugged together, the aerosol-generating device can read which conductors of the circuit of the aerosol-generating device are closed by the conductive portions of the consumable, and by doing so, determine the properties values of the consumable. The encoded information could then be used to adapt the functioning of the aerosol-generating device to the consumable, to transmit information related to the consumable, etc.

In one or more embodiments, the overall structure of the invention may be described as follows. There may be zones of the aerosol-generating device and consumable that are "in contact" when the aerosol-generating device and the consumable are plugged together, which may be referred to as "contact zones." Such contact zones could be, for instance, an inside surface of an edge of the aerosol-generating device and an outside surface of an edge of the consumable in an example where the aerosol-generating device edge is overlapping the consumable edge when the consumable is plugged into the aerosol-generating device. The contact zones of the aerosol-generating device and of the consumable may be made of nonconductive material, e.g., material having a dielectric property.

In the indicated contact zone on the aerosol-generating device, there may be an array of pairs, or couples, of coupling areas and there is at last one electronic circuit on the aerosol-generating device that includes an array of pairs, or couples, of conductors associated with and electrically coupled to the coupling areas. Further, such coupling areas may be configured such that each area is may be described as where each of a pair of conductors ends, or are discontinued, such that each of the conductors is discontinuous in the contact zone on the aerosol-generating device. Still further, at last one electronic circuit of the aerosol-generating device may be able to determine, for each of the pair of conductors, if the pair of conductors is connected together or not. Likewise, in the contact zone on the consumable, there is an array of electrical conductive portions such that each conductive portion is associated to one or more pairs of coupling areas of the aerosol-generating device, that the coupling areas associated to a pair of conductors of the aerosol-generating device are covered and connected by the conductive portions of the consumable, and that the number of the conductive portions are less or equal to the number of pairs of coupling areas of the aerosol-generating device. In one or more embodiments, for one or more of the aerosol-generating device and the consumable, one or more of the conductive portions or coupling areas may be, or define, a square surface. Further, in one or more embodiments, a length of an edge of a coupling area may be equal to the smallest dimensions between length and width of a conductive portion (so the coupling area is covered by the conductive portion).

Additionally, it may be described that the coupling areas of the aerosol-generating device and the coupling areas of the consumable are in contact and overlapping when the aerosol-generating device and the consumable are connected. In such configuration, when the consumable and the aerosol-generating device are connected, and if there is at least one conductive portion on the consumable, the conductive portion may close at least one pair of conductors on the aerosol-generating device side.

All scientific and technical terms used herein have meanings commonly used in the art unless otherwise specified. The definitions provided herein are to facilitate understanding of certain terms used frequently herein. As used herein, the singular forms "a", "an", and "the" encompass embodiments having plural referents, unless the content clearly dictates otherwise. As used herein, "or" is generally employed in its sense including "and/or" unless the content clearly dictates otherwise. As used herein, "have", "having", "include", "including", "comprise", "comprising" or the like are used in their open-ended sense, and generally mean "including, but not limited to". It will be understood that "consisting essentially of", "consisting of", and the like are subsumed in "comprising," and the like. The words "preferred" and "preferably" refer to embodiments of the invention that may afford certain benefits, under certain circumstances. However, other embodiments may also be preferred, under the same or other circumstances. Furthermore, the recitation of one or more preferred embodiments does not imply that other embodiments are not useful, and is not intended to exclude other embodiments from the scope of the disclosure, including the claims.

Reference will now be made to the drawings, which depict one or more example embodiments described in this disclosure. However, it will be understood that other example embodiments not depicted in the drawing fall within the scope and spirit of this disclosure. Like numbers used in the figures refer to like elements, steps and the like. However, it will be understood that the use of a number to refer to an element in a given figure is not intended to limit the element in another figure labeled with the same number. In addition, the use of different numbers to refer to elements in different figures is not intended to indicate that the different numbered elements cannot be the same or similar to other numbered elements.

As shown in FIG. 1, an example aerosol-generating device 100 may include a cavity 132 for receiving a consumable 104 such as a heat stick and a heater 134, which is configured to provide a source of heat to the consumable 104 thus producing inhalable aerosol. In other words, the aerosol-generating device 100 may include a "blade" 134 that can be inserted into a consumable 104 which is a stick having inside a tobacco-leaves compound. The aerosol-generating device 100 further includes a controller 128 comprising one or more processors and associated memory. The controller 128 may be operatively coupled to the heater 134 to operate the heater. The controller 128 may further include a communication interface such as, e.g., a wireless communication interface to, for example, communicate with a user interface device. The communication interface of the controller 128 may preferably comprise a BLUETOOH interface. Electrical circuitry for controlling the aerosol-generating device 100 may include the controller 128. The aerosol-generating device 100 may further include a power supply 126. The aerosol-generating device 100 may further include a display 112 operably coupled to the controller 128 to depict information. Preferably, the display 112 may be a liquid crystal display (LCD) to indicate various information regarding the consumable 104. Further, the display 112 may include one or more light-emitting diodes (LEDs) to various information regarding the consumable 104.

Although this illustrative aerosol-generating device 100 is a device configured to use a solid consumable such as a heat stick, it is to be understood that any aerosol-generating device configured to generate aerosol using aerosol-producing substrates may use or be used by the invention described herein. Many other examples of aerosol-generating devices may be usable with the invention such as, for example, a device that uses a consumable having a liquid storage portion for a liquid aerosol-producing substrate. Further, for example, the device need not be a smoking device. Still further, the aerosol-producing substrate may be another form of substrate such as a gas substrate. And still further, the heating element may take any appropriate form so as to provide aerosol production or generation from the selected form or type of aerosol-producing substrate. Yet still further, the overall shape and size of the housing could be altered and the housing could comprise a separable shell and mouthpiece, and other variations are still possible.

Example aerosol-generating devices, example consumables, and their elements thereof will be depicted diagrammatically and illustratively in FIGS. 2-12. An illustrative aerosol-generating device 200 is interfacing with a consumable 210 in FIGS. 2A-2B. In FIG. 2A, the aerosol-generating device 200 and consumable 210 are apart and the contact zone 201 of the aerosol-generating device 200 and the contact zone 211 of the consumable 210 are represented as flat surfaces. As shown, the aerosol-generating device 200 includes 3 pairs 202 of conductors 203. Each of the conductors 203 includes a coupling area 204 located in the contact zone 201. In other words, it may be described that there is an array of conductive lines, or conductors, 203, and an array of coupling areas 204. The conductors 203 may be connected to and extend from an electronic circuit 209 to the coupling area 204. The electrical circuitry may include the electronic circuit 209 and the conductors 203.

On the contact zone 211 of the consumable 210, there is one or more conductive portions 212. Each of the conductive portions 212 may include coupling areas 215 either coupled or uncoupled by a conductive line 214. As shown, the contact areas 215 of the consumable 210 may align with the coupling areas 204 of the aerosol-generating device 200 such that when the consumable 210 is interfaced with the aerosol-generating device 200 as shown in the FIG. 2B, the coupling areas 215 of the consumable may contact, or touch, the coupling areas 204 of the aerosol-generating device 200.

Figure 2A:
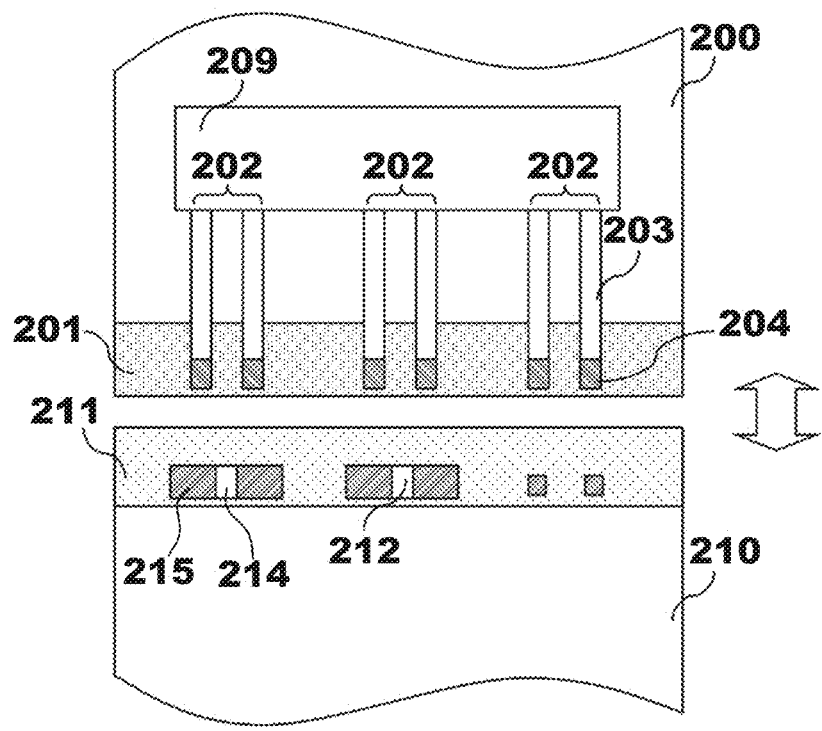
FIGS. 2A-2B are schematic sectional views of an illustrative aerosol-generating device 200 interfacing with a consumable 204.
Figure 2B:
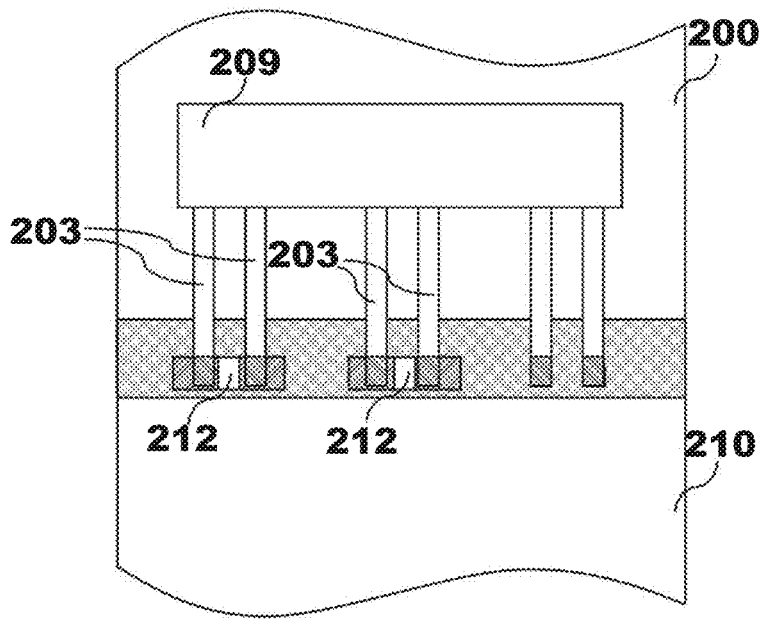

In FIG. 2B, two of the pairs 202 of conductors 203 of the aerosol-generating device 200 are electrically coupled by the conductive portions 212 of the consumable 210. In other words, the aerosol-generating device 200 and the consumable 210 are connected, and the contact zones 201, 211 are overlapping such that the conductive portions 212 of the consumable 210 are overlapping some coupling areas 204 of conductors 203 of the aerosol-generating device 200 so are connecting two pairs 202 of conductors 203, which can be detected by the circuit 209.

In this and other embodiments, the electronic circuit 209 of the aerosol-generating device 200 may be able to determine which pairs 202 of conductors 203 have its lines connected together, and may use this information as values of properties of the consumable 210. According to the configuration of the aerosol-generating device 200, this information could be then directly used by the electronic circuit 209 (for instance, in case the information is related to heating temperature of the consumable 210 and that the electronic circuit 209 is controlling the heating process of the consumable 210) or could be transmitted by bus to another electronic part of the aerosol-generating device 200 to use it (for instance, in case the information is to be displayed on the outside surface of the aerosol-generating device 200 or on a mobile phone wirelessly connected to the aerosol-generating device 200).

Figure 3:
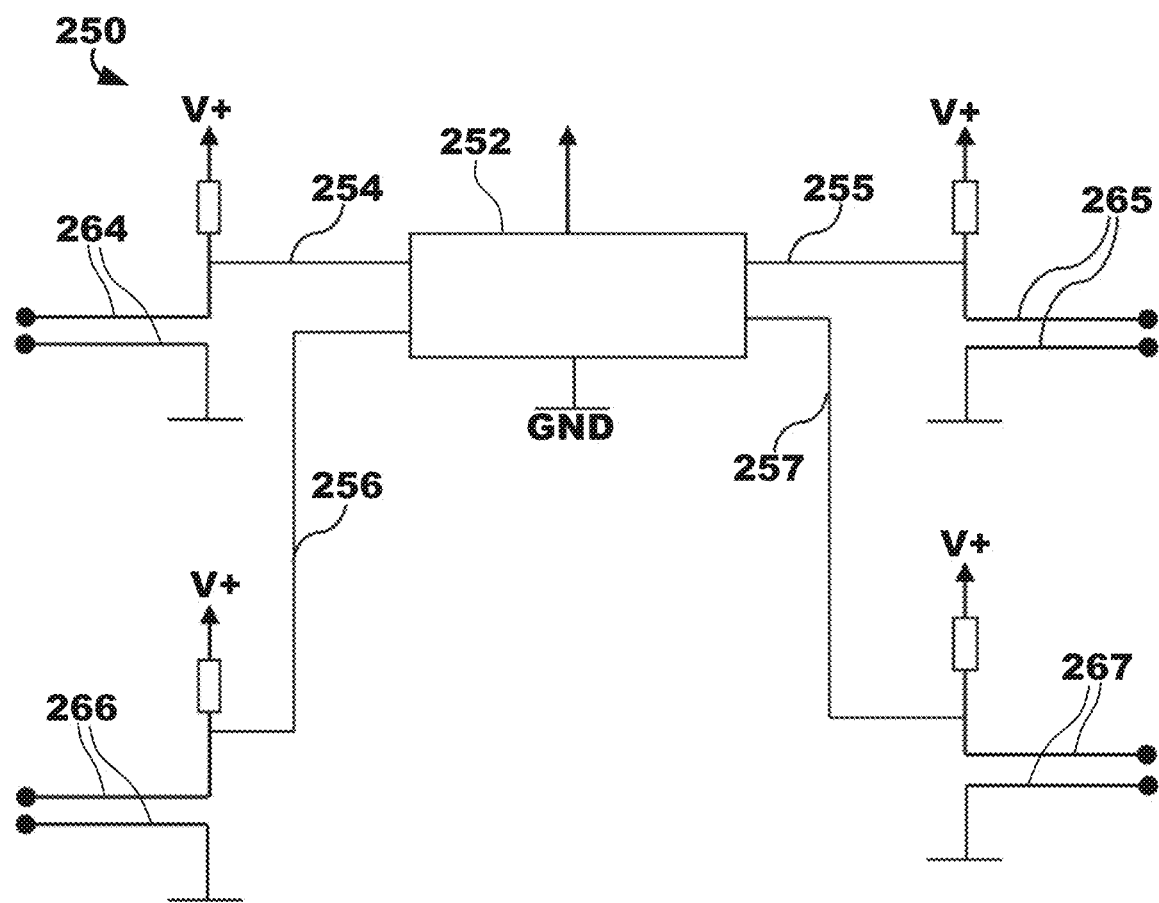
FIG. 3 is a diagram of an illustrative circuit 250 of an aerosol-generating device for use in identifying a consumable.

An illustrative circuit 250 of an aerosol-generating device for use in identifying a consumable is depicted in FIG. 3. As shown, the electronic circuit 250 of the aerosol-generating device may include a microcontroller 252 which checks the levels of its input/output conductors, or lines, 254, 255, 256, 257. It is to be understood that there are four I/O conductors, or lines, 254, 255, 256, 257 in the illustration, but this number could vary according to embodiments. When the consumable is not connected to the aerosol-generating device, these I/O conductors 254, 255, 256, 257 are at a voltage V+. The electrical circuitry may include the microcontroller 252.

Each I/O conductor 254, 255, 256, 257 has a pair, or couple, of discontinued conductors 264, 265, 266, 267 included in the electronic circuit 250 and associated therewith. For instance, one pair of conductors 265 are associated with, or to, the I/O conductor 255. Each I/O conductor 254, 255, 256, 257 will go from high state to low state in case of short circuit of the pair of conductors 264, 265, 266, 267 associated therewith (for example, cause by a conductive portion of a consumable), and this change of state can be monitored by the microcontroller 252.

Thus, when a consumable is received by the interface of an aerosol-generating device, the conductive portions of the consumable may contact and electrically couple one or more of the pairs of 264, 265, 266, 267 of the circuit 250, and the microcontroller 252 may determine which of the pairs 264, 265, 266, 267, and in turn, I/O conductors 254, 255, 256, 257 are "live" such that information may be determined from the consumable.

Figure 4:
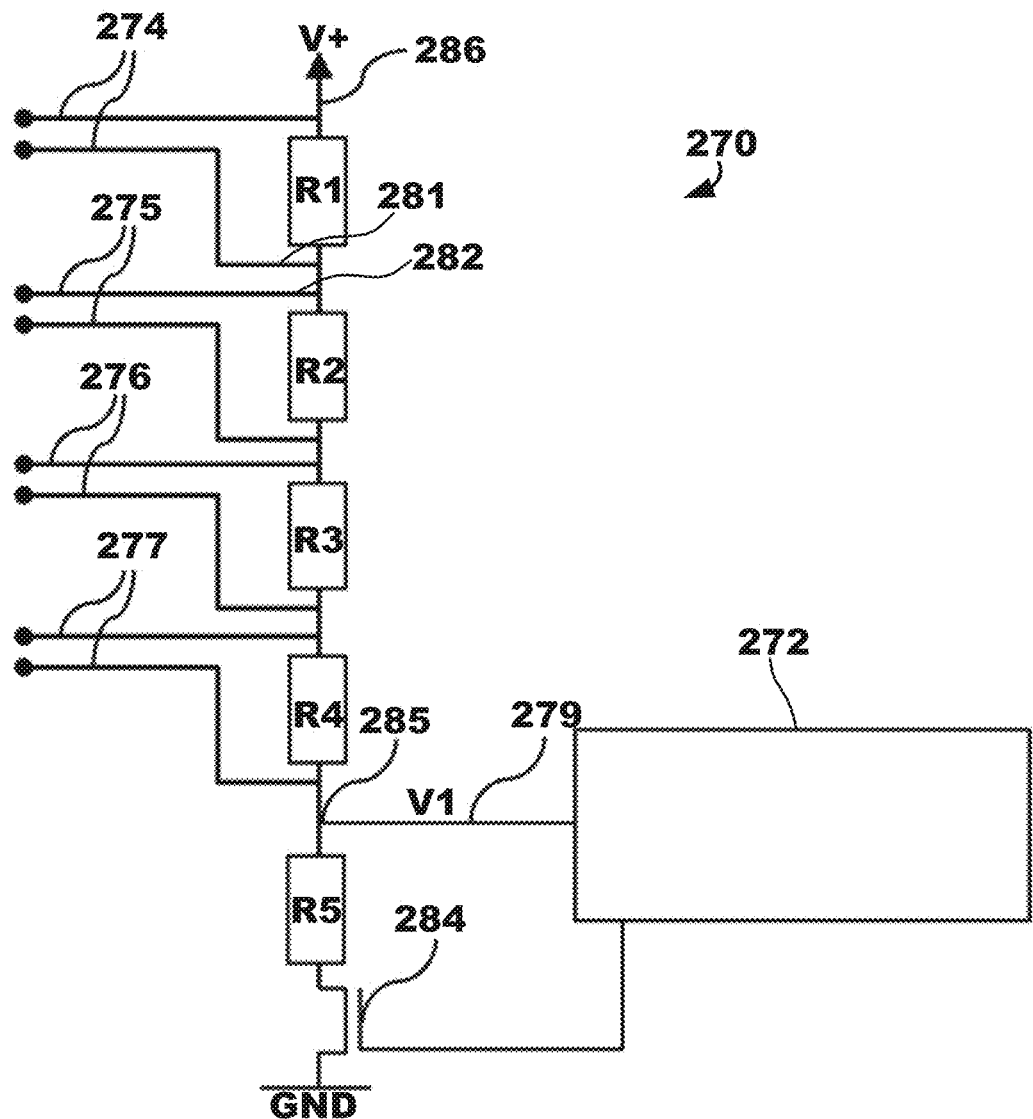
FIG. 4 is diagram of another illustrative circuit 270 of an aerosol-generating device for use in identifying a consumable.

Another illustrative circuit 270 of an aerosol-generating device for use in identifying a consumable is depicted in FIG. 4. As shown, a microcontroller 272 is connected to several resistors R1, R2, R3, R4, and R5 electrically coupled in series. In practice, the V+ lines that connect the resistors R1, R2, R3, R4, and R5 may be connected to the power source through a transistor and the microcontroller 272. It would allow in this case the microcontroller 272 to cut off the current in these lines when measurements are not required and so decrease current consumption. Although four pairs, or couples, of conductors 274, 275, 276, 277 are depicted in this embodiment, it is to be understood that the number of pairs of conductors could vary while using the same kind of embodiment. The electrical circuitry may include the microcontroller 272 and the resistors R1, R2, R3, R4, and R5.

The conductor, or line, 279 coming out of the microcontroller 272 is going downstream to a resistor R5 and then to the ground (GND), and upstream, to several resistors R1, R2, R3, R4 in serial, so that each of these 4 resistors is associated to a respective pair of discontinued conductors 274, 275, 276, 277. For instance, resistor R1 is associated to the pair of conductors 274, which, when they are in short circuited by a conductive portion of a consumable, places the resistor R1 in short circuit.

In this illustration, the microcontroller 272 may start by measuring the voltage V1 on the line 279. So as to limit the power consumption, an option, illustrated here, is to have a transistor 284 switched ON by the microcontroller 272 prior to detection. The resistor R5 value is known, and so the current I circulating may be determined by I=V1/R5 (Ohm's law). Knowing the current, the actual total upstream resistance Rt between the points 285 and 286 could be determined as: Rt=(V+)/I. Because the upstream resistors R1, R2, R3, R4 in serial, Rt is the sum of the upstream resistances which for each of them is equal to the resistor value in case the resistor is not in short circuit and equal to 0 in case of short circuit.

By using appropriate values for the four upstream resistors R1, R2, R3, R4 (such as different resistance values for each of the resistors R1, R2, R3 and R4), knowing Rt may allow the microcontroller 272 to determine which of these four resistors R1, R2, R3, R4 are in short circuit. For example, a table or formula may be used to determine which of these four resistors R1, R2, R3, and R4 are in short circuit. A table 280 depicting illustrative total resistance values, Rt, corresponding to pairs of conductors 274, 275, 276, 277 of the circuit of FIG. 4 for use in identifying a consumable is depicted in FIG. 5. A shown, the table 280 may be used determine which of the pairs of conductors are in short circuit according to the calculated value Rt, and using the following standard resistor values, R1=100K, R2=47K, R3=22K, and R4=10K. In the table, an "X" means no short circuit, and no "X" means short circuit. Thus, an "X" means that no conductive portion of a consumable has electrically coupled the pair of conductors and no "X" means that a conductive portion of a consumable has electrically coupled the pair of conductors. Although the table 280 only depicts seven total resistance, Rt, values, and associated shorted or not shorted combinations, it is to be understood that the table may include all of the potential total resistance, Rt, values, and associated shorted or not shorted combinations of the pairs of conductors 274, 275, 276, 277 (as indicated by the ellipsis).

Appropriate values for the group of upstream resistors R1, R2, R3 and R4 are values such that knowing the sum S of all the R(i)*W(i), where R(i) is the upstream resistor value of the resistor i and W(i) a weight randomly equal to 0 or 1, allows to know the values of each W(i). For instance, when R(i+1)=2*R(i), then knowing the sum S of all R(i)*W(i) provides the values of all W(i). In case W(i) is equal to 0, then the associated resistor is in short circuit.

Further, in this embodiment, two successive pairs of conductors 274, 275, 276, 277 may share a conductor due to, e.g., the serially-connected nature of the circuit 270. For example, the last line of the upstream pair 274, 275, 276, 277 could be merged with the first line of the next downstream pair 274, 275, 276, 277. For instance, conductor 281 of the pair 274 could be merged with conductor 282 of the pair 275, which may help to create compact circuit 270 on the device.

Figure 6:
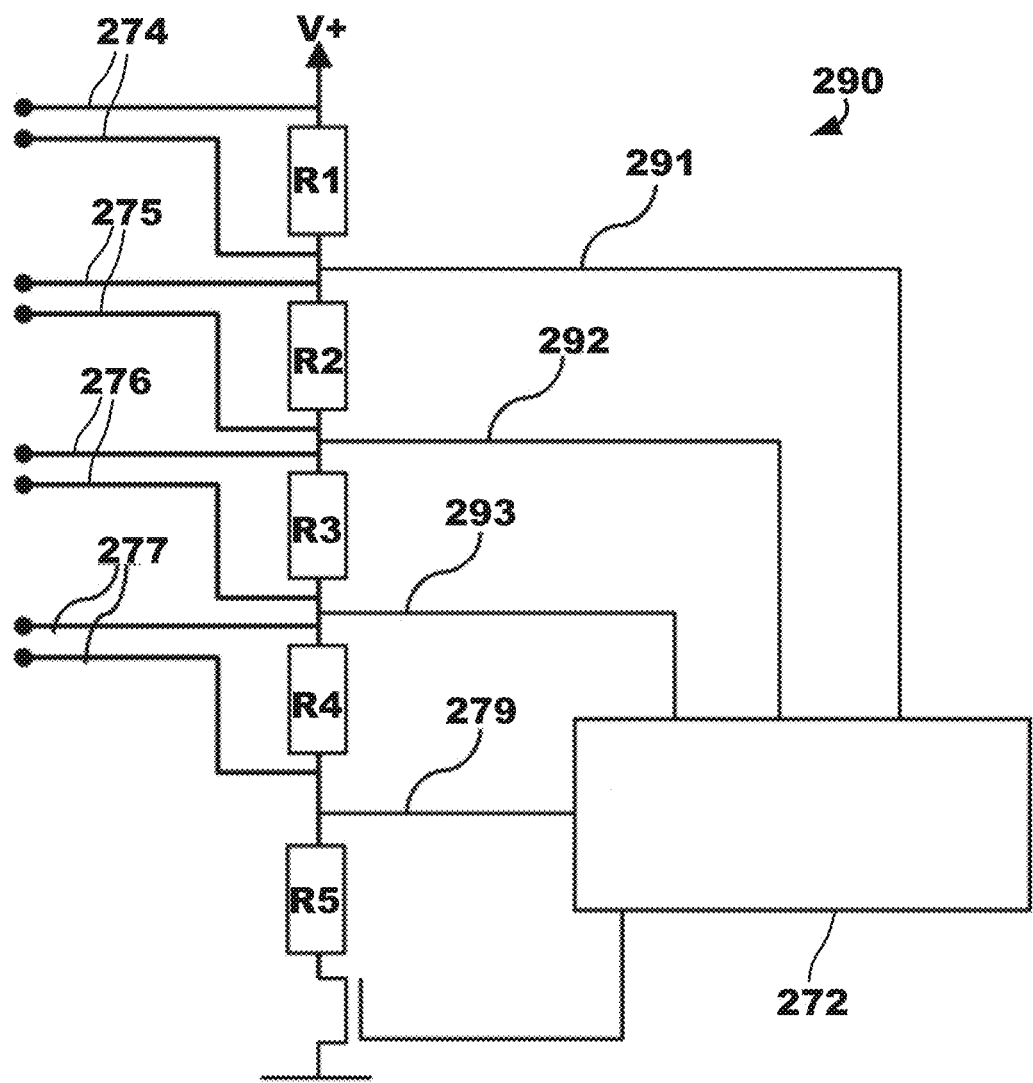
FIG. 6 is diagram of another illustrative circuit 290 of an aerosol-generating device for use in identifying a consumable.
Figure 7:
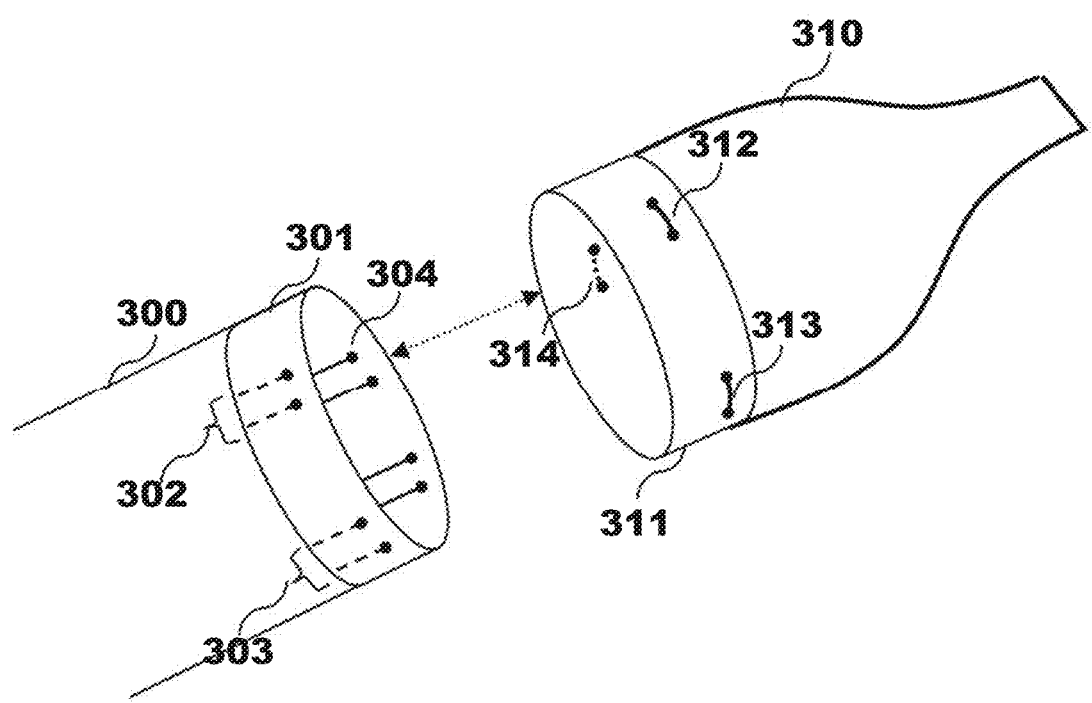
FIG. 7 is perspective, partially-transparent view of an illustrative aerosol-generating device 300 interfacing with a consumable 310.

Another illustrative circuit 290 of an aerosol-generating device for use in identifying a consumable is depicted in FIG. 6. As shown, circuit 290 may be described as a variation of the circuit 270 of FIG. 4 with conductors, or lines, 291, 292, 293 coming from the microcontroller 272 to the upstream resistor path, so as to evaluate directly the difference of voltage between each of the resistors R1, R2, R3, and R4. In case the difference of voltage is 0, it means that the resistor, and so the pair of conductors associated to it, is in short circuit. For instance, if the difference of voltage between the conductors 279 and 293 is null, it means that the pair, or couple, of lines 277 is in short circuit. With such embodiment, it is no more mandatory to have resistor with different values as the short circuits are no more determined by the sum of the resistance but by direct evaluation of the voltage between the resistors.

Illustrative aerosol-generating devices and consumables may have "keyed" or "un-keyed" coupling. In the "keyed" coupling configuration, the consumable can be connected/ plugged into the aerosol-generating device in only one way. In such "keyed" configuration, when the aerosol-generating device and the consumable are connected, the disposition of where the couplings areas of the conductive portions of the consumable are made and known in advance so as to be in contact with the coupling areas of the aerosol-generating device.

For example, if there are four pairs of couplings areas C1, C2, C3, C4 on a consumable, and four pairs of conductors L1, L2, L3, L4 on the aerosol-generating device, then when plugging the consumable into the aerosol-generating device, conductive lines between the two coupling areas of some of the coupling areas of the consumable are in short circuit determined by the pairs of conductors of the aerosol-generating device. In this case there are 2 exp(4)=16 possible combinations for the four pairs of conductors of the aerosol-generating device (each can be in short circuit or not), so 16 different pieces of information can be determined from the conductive portions of the consumable by the aerosol-generating device to identify properties of the consumable.

A perspective, partially-transparent view of an illustrative aerosol-generating device 300 interfacing with a consumable 310 is depicted in FIG. 7. As shown, the aerosol-generating device 300 may be an "e-cigarette" and the consumable 310 may be a cartridge filled with e-liquid that may be plugged into the aerosol-generating device 300 so that the e-liquid which is inside the cartridge can be heated. The consumable 310 may have, or define, a keyed connection with the aerosol-generating device 300, and may be made, or configured, to be plugged into the aerosol-generating device 300 so that in the contact zone 301 of the aerosol-generating device 300 and the contact zone 311 of the consumable 310 are in contact and coupled together such that the conductive portions of the consumable 310 may be in contact with one or more pairs of conductors of the aerosol-generating deice 300. More specifically, the outside surface of the contact zone 311 of the consumable 310 may be in contact with and coupled to the inside surface of the contact zone 301 of the aerosol-generating device 300.

Further, in this embodiment, the consumable 310 includes three conductive portions 312, 313, 314 on the side of the contact zone 311 that may short circuit three pairs of conductors 302, 303, 304 on the contact zone 301 of the aerosol-generating device 300 among the four pairs of conductors available on the aerosol-generating device 300.

In examples where the consumable and the aerosol-generating device do not have a keyed connection, then it may not possible to fix in advance which areas of the aerosol-generating device and which the areas of the consumable may overlap in the contact zones when the aerosol-generating device and the consumable are plugged together. In such examples, in a preferred embodiment, the pairs of conductors on the aerosol-generating device may make a regular pattern along the perimeter of the contact zone of the aerosol-generating device, so that, for all the pairs of conductors: the spacing between two pairs of lines is L1; the spacing between two conductors of the same pair of conductors is L2; and the width of a conductor is equal to L3. By doing so, to connect the two conductors of a pair of conductors and only these two conductors, a conductive portion on the consumable should have the length $L=L1+(2\times L2)+(3\times L3)$, which is true whatever the consumable's final position with respect to the aerosol-generating device when the aerosol-generating device and the consumable are plugged, as shown hereunder. In such examples, the lengths of the conductive portions could be L or a multiples of L. When the length of a conductive portion is $n\times L$, there will be n pairs of conductors of the aerosol-generating device that will be put in short circuit by the conductive portion of the consumable.

Figure 8:
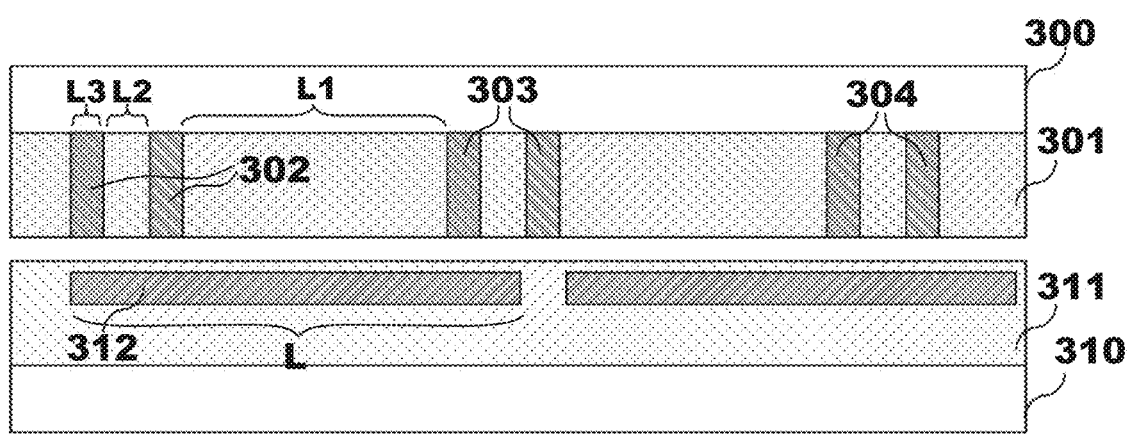
FIG. 8 is a schematic sectional view of an illustrative aerosol-generating device 300 interfacing with a consumable 310.

As shown in FIG. 8, an aerosol-generating device 300 and a consumable 310 are slightly apart and the contact zone 301 of the aerosol-generating device 300 and the contact zone 311 of the consumable 310 are represented as flat surfaces. On the contact zone 301 of the aerosol-generating device 300, there is an array of pairs of conductive lines 302, 303, 304 having the dimensions L1, L2, L3 indicated herein. On the contact zone 311 of the consumable 310, there is an array of conductive portions, or lines, 312 so that some of the lines have a length $L=L1+(2\times L2)+(3\times L3)$ allowing them to short circuit at least one pair of conductors 302, 303, 304 regardless of position of the consumable 310 with respect to the aerosol-generating device 300 when mated. In other words, whatever the final position the consumable 310 and the aerosol-generating device 300 find themselves with respect to each other when coupled together such that their contact zones 301, 311 are in contact and mated, only two conductors of the same pair of conductors on the aerosol-generating device 300 may be shorted.

In such embodiment, the electronic circuit of the aerosol-generating device 300 can count the number of pairs of conductors which are short circuited, and this is the information may be used to read the values of properties of the consumable 310 (e.g., the identity of the consumable). If the conductive portions, or lines, of the consumable 310 all have the same length L, then the number of pairs of conductors that are closed on the aerosol-generating device 300 will be equal to the number of conductive portions on the consumable 310. The total number of different possible pieces of information (e.g., identifiers) that can be read in such way is related to the dimensions of the contact zones as well as the dimensional tolerance of the conductive portions which could be different according to the material used and nature of the aerosol-generating device and consumable. Some examples of such kind of embodiments without keyed connection between an aerosol-generating device and a consumable are as follows. In a first example, the aerosol-generating device article may be a device that heats a blade, which is inserted into a tobacco stick acting as the consumable. In this example, the tobacco stick may be tubular and could be inserted on the blade after any kind of rotation along its longitudinal axis, so the stick has no keyed connection with the aerosol-generating device. In such case, the indicated kind of embodiment could be applied, with conductive portions, or lines, being put on the outside surface of the stick (e.g., on the stick wrapping paper acting as the container of the consumable), and an array of pairs of conductors in the inside surface of the aerosol-generating device). In such embodiment, the conductors on the aerosol-generating device could be made thicker to increase the contact with the tobacco stick which outside surface could be a bit flexible.

Figure 9:
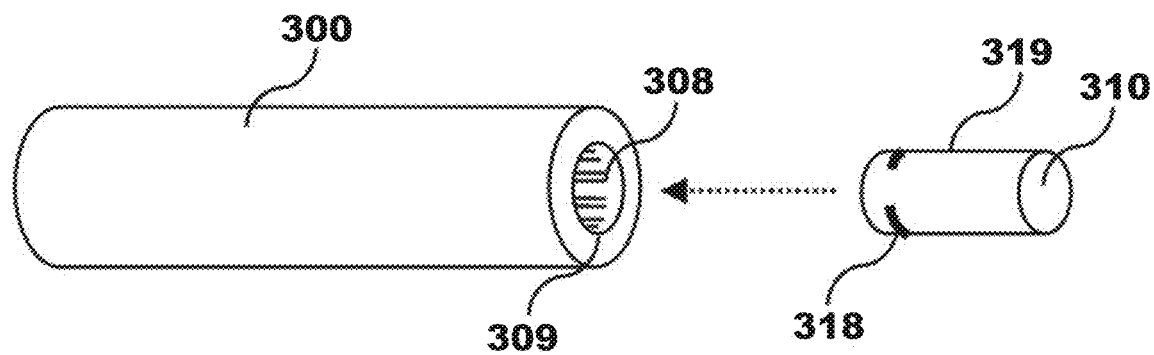
FIG. 9 is side perspective view of an illustrative aerosol-generating device 300 interfacing with a consumable 310.

An illustrative aerosol-generating device 300 interfacing with a consumable 310 is depicted in FIG. 9. As shown, the aerosol-generating device 300 has, or defines, an opening 309 where the consumable 310, e.g., a tobacco stick, may be to be inserted to be heated by a blade. The consumable 310 may include a wrapping paper 319 on the outside surface acting as a container and conductive portions, or lines, 318 on the wrapping paper 319 that will short circuit pairs of conductors 308, which are on the inside surface of the opening 309 of the aerosol-generating device 300. These conductive portions 318 have the properties indicated above for the non-keyed connection. The number of short circuits of pairs of conductors 308, as read by the electronic circuit of the aerosol-generating device 300, will give to the aerosol-generating device 300 information about the consumable 310.

In a second example, the consumable may use an e-liquid coming from a bottle, which acts as the container, and the aerosol-generating device may have a specific tank where the e-liquid is to be poured into. In such cases that have an e-liquid but no cartridge, a connection between the aerosol-generating device and the consumable, for instance to automatically find the best heat profile for the e-liquid, can be done by having on the aerosol-generating device a specific zone (for instance, the opening for the e-liquid) that can be connected/plugged on a part of the bottle of the consumable, like the opening of the bottle or the bottle cap (e.g., both of them are usually round, so could use the non-keyed embodiments with the aerosol-generating device).

According to other embodiments where the consumable is heated by an element inside the container of the consumable and powered by the aerosol-generating device, with keyed connection or no keyed connection between the aerosol-generating device and the consumable, at least one of the conductive portions on the consumable may be electrically coupled to an element acting as a heater for the aerosol-forming substrate of the consumable. Such element could be for instance a mesh heating by Joules law/resistance. In such embodiment, the overall function of the aerosol-generating device may be unchanged, e.g., the aerosol-generating device may provide electrical power to heat an element of the consumable; however, using the apparatus, devices, and methods described herein, the heater may also be part of an identification process of the consumable.

In one or more such embodiments, all the conductors of the array of pairs of conductors of the aerosol-generating device may be "power lines" (e.g., conductors configured to transmit electricity for power delivery to powered devices such as heaters) dedicated to possibly heat a consumable using at least one heater connected to at least one the conductive portions of the consumable. In one or more embodiments, the conductive portions of the consumable that are not connected to a heater may or may not be short circuited for identification purposes while at least one of the conductive portions may be coupled to a conductor of the aerosol-generating device to carry power from the aerosol-generating device to the heater. In other words, the conductive portions of the consumable may be connected to at least a heater to generate a voltage on the pairs of conductors of the aerosol-generating device connected to them. Such voltage can be detected by the electronic circuit of the aerosol-generating device and its value can also participate in the identification of the consumable. The identification of the consumable (or of a property of the consumable) may be completed by checking the pairs of conductors of the aerosol-generating device that are short circuited, the pairs of conductors that have a voltage between them (e.g., indicating one or more heaters—as well as possibly the value of the voltage) and the pairs of conductors which are disconnected.

Such configuration may be designed such that the overall architecture of such smoking article may already have one or more heaters in the consumable that may use electrical power from the aerosol-generating device. As such, the heater(s) while functioning as expected, e.g., to heat the consumable, could also serve to transmit information to the aerosol-generating device about the consumable.

In other embodiments with the heater as part of the consumable and keyed connection between the consumable and the aerosol-generating device, two conductors of the pairs of conductors of the aerosol-generating device may be merged, two coupling areas of the conductive portions of the consumable may be merged, and when the aerosol-generating device is connected to the consumable, at least one heater element of the consumable may connect at least one conductor of the aerosol-generating device to another conductor of the aerosol-generating device. Because the position of this at least one heater element could be different from one kind of consumable (e.g., and container) to the other, the heater position, as indicated by the pairs of conductors of the aerosol-generating device connecting (and which could be detected by the electronic circuit of the aerosol-generating device) may act as an identification of the consumable, while the heater(s) heat the consumable as expected from them.

Figure 10:
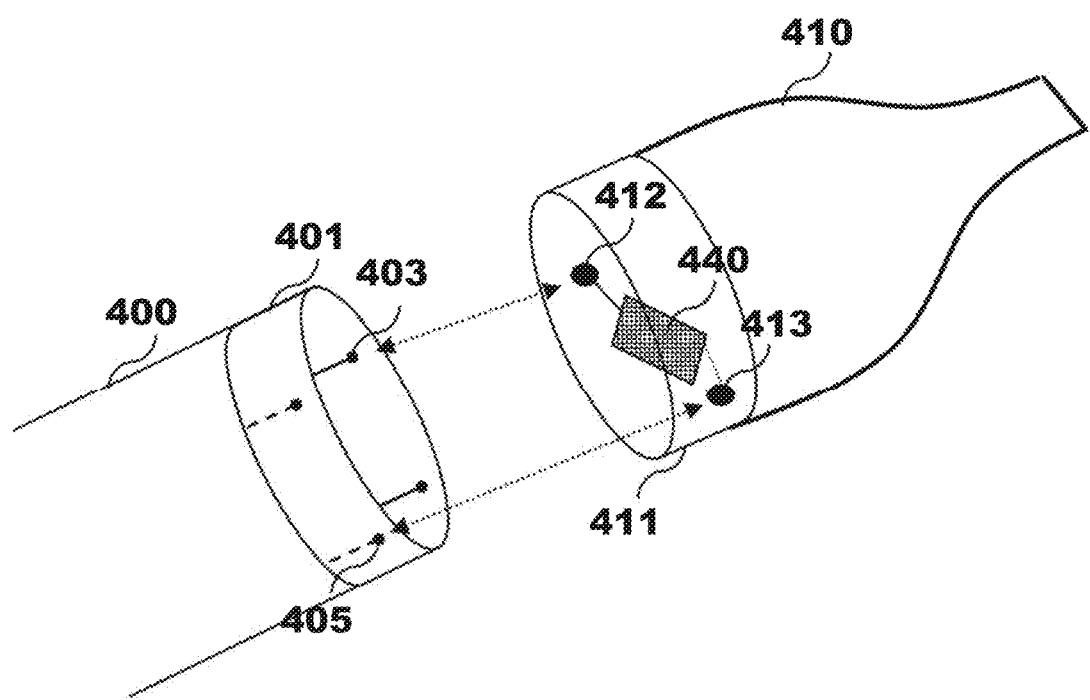
FIG. 10 is perspective, partially-transparent view of an illustrative aerosol-generating device 400 interfacing with a consumable 410.

A perspective, partially-transparent view of an illustrative aerosol-generating device 400 interfacing with a consumable 410 is depicted in FIG. 10. As shown, the consumable 410 is a cartridge filled with e-liquid, which has a keyed connection to the aerosol-generating device 400, and which is made to be interfaced with, or plugged into, the aerosol-generating device 400 so that in the contact zone 401 of the aerosol-generating device 400 and the contact zone 411 of the consumable 410 are in contact and coupled together. The illustration shows four power conductors, or lines, two of which are labeled as 403, 405 on the aerosol-generating device 400 but other embodiments could have more or less power conductors.

As shown, the consumable 410 has two conductive portions, or coupling areas, 412, 413 that are electrically connected to a heater 440, and which may be electrically coupled to and in contact with the two power conductors 403, 405 of the aerosol-generating device 400 when the consumable 410 is plugged into the aerosol-generating device 400. When doing so, the power conductors 403, 405 of the aerosol-generating device 400 will provide energy to the heater 440 via the conductive portions 412, 413 of the consumable 410, and the voltage generated by the heater 440 on the power conductors 403, 405 versus the other power lines of the aerosol-generating device 400 which are open, will allow to the aerosol-generating device 400 identify the position of the heater 440 which can be used as an identification of the consumable 410.

Figure 11:
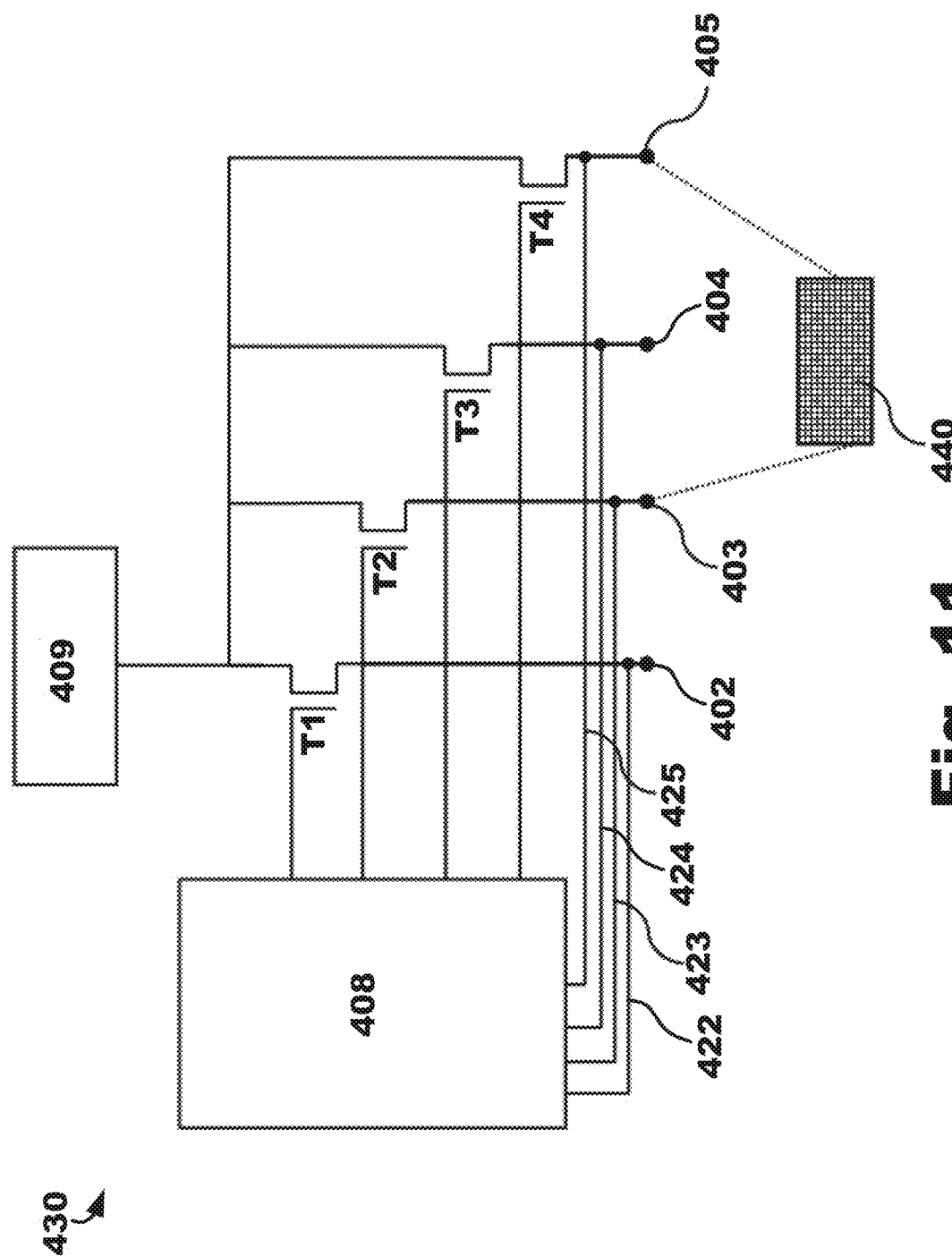
FIG. 11 is diagram of an illustrative circuit 430 of the aerosol-generating device 400 for use in identifying a consumable.

A diagram of an illustrative circuit 430 of the aerosol-generating device 400 for use in identifying a consumable 410 is depicted in FIG. 11. As shown, the circuit 430 of the aerosol-generating device 400 includes four power conductors 402, 403, 404, 405 and a heater 440 connected to two of these power lines (indicated by the dotted lines coupling the heater 440 to the conductors 403, 405) when the aerosol-generating device 400 and the consumable 410, which includes the heater 440 in this embodiment, are connected.

When checking the position of the heater 440, a microcontroller 408 of the aerosol-generating device 400 may use the transistors T1, T2, T3, and T4 to activate successively the power conductors, or lines, 402, 403, 404, 405, two by two, while checking the voltages of the activated lines. The circuit 430 may further include an I/O line 422, 423, 424, 425 for each of the power conductors, or lines, 402, 403, 404, 405. The I/O lines 422, 423, 424, 425 may be electrically coupled to each of the conductors, or lines, 402, 403, 404, 405 and the microcontroller 408. The microcontroller 408 may use the I/O lines 422, 423, 424, 425 to determine when the power conductors 402, 403, 404, 405 are coupled to the heater 440. For example, when activating the conductors 403, 405 and checking their voltages via its I/O lines 423, 425, the microcontroller 408 will detect a voltage difference corresponding to the heater 440 since, as indicated in this illustration through the use of dotted lines, conductors 403, 405 are electrically coupled to the heater 440. The microcontroller 408 could use the position of the heater 440, indicated by which of the power lines 402, 403, 404, 405 the heater 440 are connected to, as an identification of the consumable 410.

Figure 12:
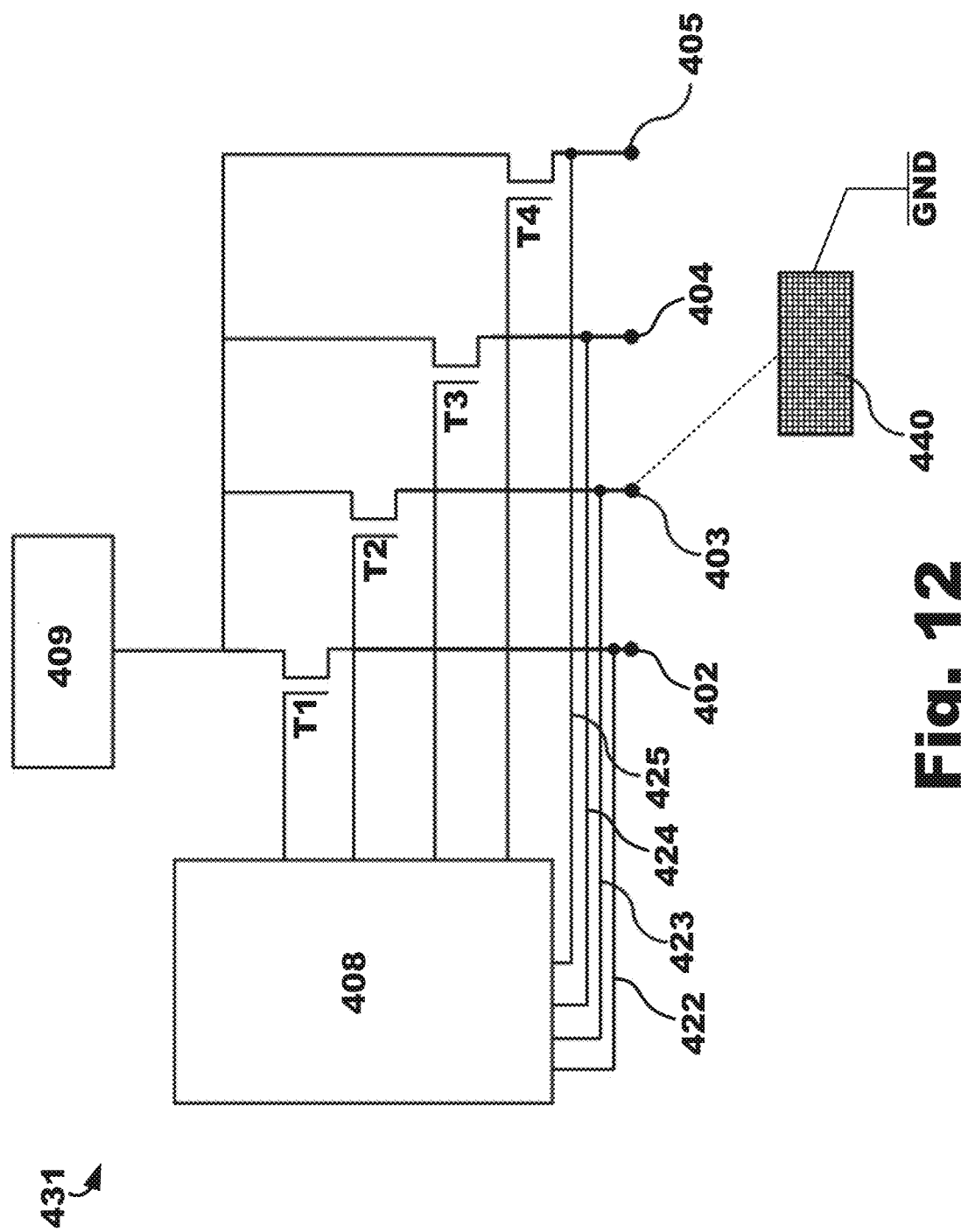
FIG. 12 is a diagram of another illustrative circuit 431 of the aerosol-generating device 400 for use in identifying a consumable.

A diagram of another illustrative circuit 431 of the aerosol-generating device 400 for use in identifying a consumable 410 is depicted in FIG. 12 that shows another way to detect the heater 440 by evaluating the resistance between two endpoints of power lines 402, 403, 404, 405.

As shown, one side of the heater 440 may be connected to the ground (GND) of the device and the other side of the heater 440 may be selectively connected to one of the power conductors, or lines, 402, 403, 404, 405. In this illustration, the heater 440 is connected to the conductor 403 as indicated by a dotted line. This variant provides the advantage for the electronics to avoid any sequence with the transistors T1, T2, T3, and T4, to detect the heater 440 contacts positions. In this case the microcontroller 408 may switch "on" all the transistors to power the heater 440 and measure directly the voltage on the lines 422, 423, 424, 425 to identify which of the conductors 402, 403, 404, 405 is connected to the heater 440. Thus, the heater position may be basically identified in the same time that power is transmitted and aerosol starts to be generated.

Other applications could be with an aerosol-generating device being an accessory of a smoking article, in case the smoking articles has no electronic inside but is using consumable or when the smoking articles is itself a consumable (for instance, smoking articles using heat source). In such examples, the aerosol-generating device could have one of the indicated electronic circuits and a shape allowing the consumable to be plugged into it. The aerosol-generating device could furthermore be a self-working device or be pluggable to another electronic device, like a mobile phone, so as to read and register information about the consumable, as read on a container of the consumable. For instance, it can be used to show the consumers' uses or choices on social networks via the mobile phone.

Figure 13:
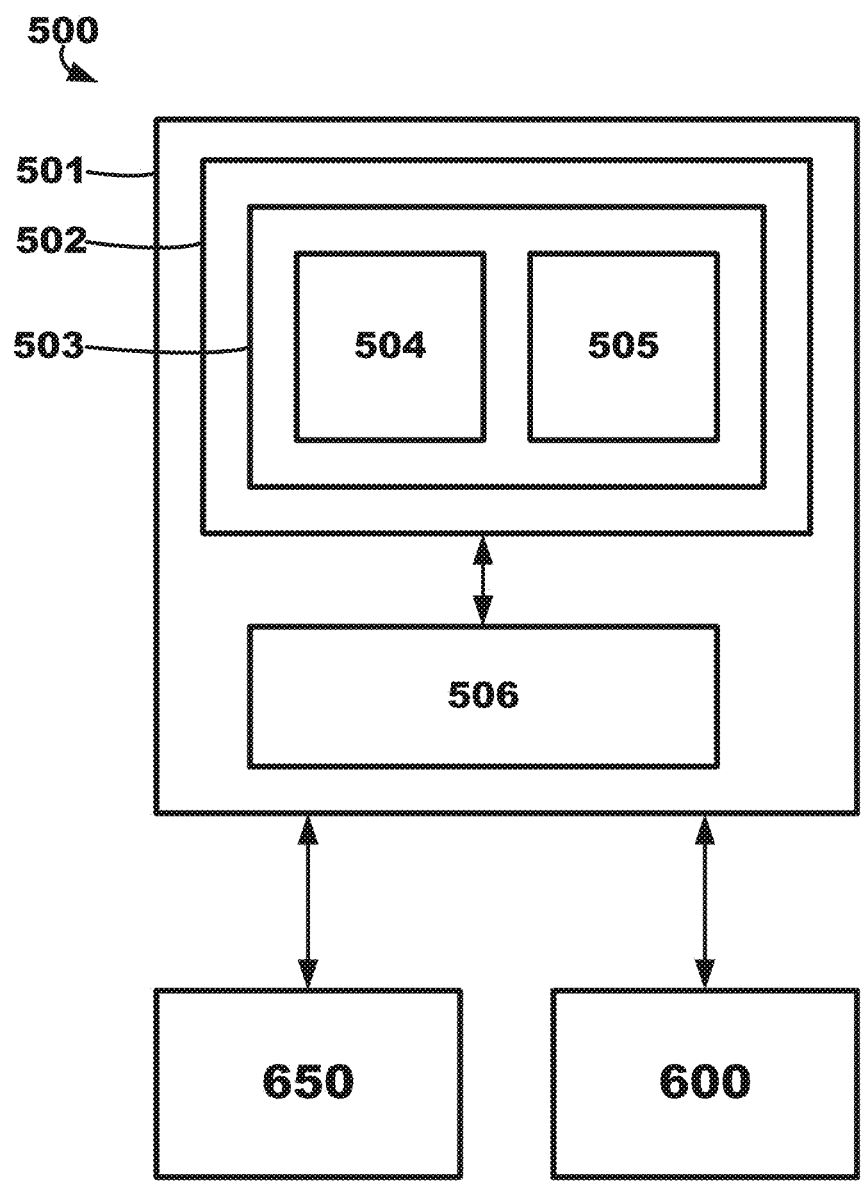
FIG. 13 is block diagram of an illustrative system 500 for use in identifying a consumable used by an aerosol-generating device.

With reference to FIG. 13, an illustrative system 500 according to the present invention is depicted. The system 500 includes a user interface device 501 and an aerosol-generating device 600. The user interface device 501 includes a controller 502 and associated data storage 503. The data storage 503 includes programs and routines 504 such as, for example, programs and routines for the acquisition of data representative of a consumable interfaced with an aerosol-generating device 600, for the transmission of information related to the aerosol-generating device 600 and the consumables used thereby, and any other programs or routines to execute the illustrative methods and processes described herein. The data storage 503 further includes data 505 such as the data regarding consumables, data linking a serial number of a consumable to additional information, information about consumables linked to various types of consumables, and the like. The user interface device 501 further includes a display 506 comprising a user-interactable, graphical user interface.

The aerosol-generating device 600 may transmit information to the user interface device 501 regarding consumables used thereby. For example, the aerosol-generating device 600 may transmit one or more of the serial number, type, expiration date, etc. of one or more consumables used thereby to the user interface device 501. In one embodiment, the aerosol-generating device 600 may transmit such information to the user interface device 501 in response to interfacing with a consumable and identifying the consumable using the apparatus and processes described herein. Further, the user interface device 501 may transmit information regarding the aerosol-generating device 600 and the consumables to other devices or apparatus across, e.g., the internet, such as an external database server 650. The database server 650 may transmit information to the user interface device 601 regarding the consumable and aerosol-generating device 600.

For example, a consumable may be interfaced with an aerosol-generating device 600, and the aerosol-generating device 600 may identify the type of consumable using the apparatus and processes described herein. The aerosol-generating device 600 may then upload, or transmit, the type of consumable being used by the aerosol-generating device 600 to the user interfaced device 501, which may perform one or more actions with respect to such data. For instance, various information regarding the consumable may be displayed on the user interface 506 of the user interface device 501 such as, e.g., the type of the consumable and other information that the user interface device 501 has stored in memory about the consumable such as ideal power settings, flavors, nicotine concentration, etc. Additionally, the user interface device 501 may not have information about the identified consumable stored in memory, and thus, may consult the database server 650. For instance, the user interface device 501 may transmit the type of consumable to the database server 650, and the database server 650 may return information regarding the consumable back to the user interface device 501.

Thus, apparatus, devices, and methods for use in identifying an aerosol-producing consumable are described. Various modifications and variations of the invention will be apparent to those skilled in the art without departing from the scope and spirit of the invention. Although the invention has been described in connection with specific preferred embodiments, it should be understood that the invention as claimed should not be unduly limited to such specific embodiments. Indeed, various modifications of the described modes for carrying out the invention which are apparent to those skilled in the electrical arts, computer arts and aerosol-generating device manufacturing or related fields are intended to be within the scope of the following claims.

The invention claimed is:

1. A consumable for use with an aerosol-generating device comprising:
   an aerosol-producing substrate; and
   conductive portions, the conductive portions being arranged in a physical pattern, the physical pattern of the conductive portions being configured to electrically connect to at least one first subset of pairs of conductors that are arranged in the aerosol-generating device to complete at least one circuit, of a plurality of circuits, that identifies the consumable, the plurality of circuits including the conductive portions and the pairs of conductors.

2. An aerosol-generating device comprising:
   an interface configured to receive at least one first portion of a consumable, the consumable including conductive portions arranged in a physical pattern;
   pairs of conductors in the interface, the pairs of conductors being configured to electrically connect to at least one first subset of the conductive portions to complete at least one circuit, of a plurality of circuits, the plurality of circuits including the conductive portions and the pairs of conductors; and
   electrical circuitry including one or more processor, the electrical circuitry operably coupled to the pairs of conductors, the electrical circuitry being configured to identify the at least one circuit that is completed to identify the consumable once the consumable is received by the interface.

3. A method of identifying a consumable comprising:
   receiving a consumable using an interface of an aerosol-generating device, the consumable including an aerosol-producing substrate and conductive portions, the conductive portions being arranged in a physical pattern; and
   identifying a completion of at least one circuit, of a plurality of circuits, based on the physical pattern of the conductive portions being electrically connected to at least one first subset of pairs of conductors once the consumable is received by the interface, the pairs of conductors being arranged on the aerosol-generating device, the plurality of circuits including the conductive portions and the pairs of conductors.

4. The consumable of claim 1, wherein the consumable further comprises:
   a container to hold the aerosol-producing substrate, wherein
   the conductive portions are coupled to the container.

5. The aerosol-generating device of claim 2, wherein the the electrical circuitry is further configured to identify the consumable by:
   applying a voltage to a first conductor of each of the pairs of conductors,
   grounding a second conductor of each of the pairs of conductors, and
   detecting the completion of the at least one circuit by determining a change of an electrical state of the at least one circuit during the applying of the voltage.

6. The aerosol-generating device of claim 2, wherein the electrical circuitry has resistance elements between a first conductor and a second conductor of each of the pairs of conductors, and the electrical circuitry is further configured to identify the consumable by:
   detecting the completion of the at least one circuit by measuring a resistance to identify the consumable, the plurality of circuits further including the resistance elements.

7. The aerosol-generating device of claim 6, wherein each of the resistance elements is bypassed for the at least one circuit that is completed.

8. The aerosol-generating device of claim 6, wherein
   the resistance elements are electrically coupled in series extending from a first node to a second node, and
   the electrical circuitry is further configured to apply a first voltage to the first node and measure a second voltage at the second conductor for each of the pairs of conductors to determine which of the plurality of circuits are completed once the consumable is received by the interface.

9. The aerosol-generating device of claim 2, wherein the interface defines one or more connection elements corresponding to a shape of the consumable to position the at least one first portion of the consumable in a single position with respect to the aerosol-generating device once the consumable is received by the interface.

10. The aerosol-generating device of claim 2, wherein
    the pairs of conductors are separated from each other by a first distance, each of the pairs of conductors including a first conductor and a second conductor, the first conductor and the second conductor of each of the pairs of conductors being separated by a second distance, and each of the conductive portions being separated from each other by a third distance, the third distance being greater than or equal to a sum of a width of three conductors, of the pairs of conductors, a first length equal to twice the second distance, and a second length equal to the first distance.

11. The aerosol-generating device of claim 2, further comprising:

at least one heating element configured to heat an aerosol-producing substrate of the consumable to generate aerosol once the consumable is receivable by the interface.

12. The aerosol-generating device of claim 10, further comprising:

a heating element configured to heat an aerosol-producing substrate of the consumable to generate aerosol; and a power source operably couplable to the heating element to provide power to the heating element via the pairs of conductors once the consumable is received by the interface.

13. The aerosol-generating device claim 12, wherein the power source is selectively electrically coupled to the first conductor of each of the pairs of conductors, the aerosol-generating device includes electrical circuitry to successively electrically couple the power source to the first conductor of each of the pairs of conductors to apply a first voltage to the first conductor of each of the pairs of conductors, and electrical circuitry is configured to determine the completion of the at least one circuit once the consumable is received by the interface and the first voltage is applied, the determining of the completion of the at least one circuit including the electrical circuitry detecting a change of an electrical state of the at least one circuit during the applying of the first voltage.

14. The aerosol-generating device of claim 2, wherein the electrical circuitry is further configured to change one or more operating characteristics of the aerosol-generating device based on the identified consumable.

15. The aerosol-generating device of claim 2, wherein the electrical circuitry is further configured to communicate the identified consumable to a user interface device.

16. The aerosol-generating device claim 2, wherein the electrical circuitry is further configured to determine information about the consumable based on the consumable that has been identified.

17. The aerosol-generating device or method of claim 16, wherein the information about the consumable includes one or more of manufacturing information, an expiration date, or a location of manufacture.

18. The consumable of claim 1, wherein the aerosol-producing substrate includes a nicotine-containing material.

19. A non-transitory computer readable storage medium including computer readable instructions stored thereon which, when run on programmable electric circuitry, causes the programmable electric circuitry to perform the method of claim 3.

20. The aerosol-generating device of claim 6, wherein each of the resistance elements includes a unique resistance.

* * * * *